(12) United States Patent
Liao

(10) Patent No.: US 6,611,427 B1
(45) Date of Patent: Aug. 26, 2003

(54) FLEXIBLE FAN MODULE

(75) Inventor: Jinny-Dyi Liao, Taichung (TW)

(73) Assignee: Accton Technology Corporation, Hsinchu (TW)

( * ) Notice: Subject to any disclaimer, the term of this patent is extended or adjusted under 35 U.S.C. 154(b) by 0 days.

(21) Appl. No.: 10/162,471

(22) Filed: Jun. 3, 2002

(51) Int. Cl.[7] .................................................. H05K 7/20
(52) U.S. Cl. ....................... 361/695; 165/121; 312/236; 454/184
(58) Field of Search .................. 165/80.3, 121–126; 312/236; 454/184; 361/687, 695, 696, 715–720; 415/213.1, 214.1

(56) References Cited

U.S. PATENT DOCUMENTS

| | | | |
|---|---|---|---|
| 5,676,199 A | * 10/1997 | Lee | 165/80.3 |
| 5,956,228 A | * 9/1999 | Zahorsky et al. | 361/695 |
| 2001/0010624 A1 | * 8/2001 | Katsui | |
| 2003/0026074 A1 | * 2/2003 | Clements | |

* cited by examiner

Primary Examiner—Gerald Tolin
(74) Attorney, Agent, or Firm—Kinney & Lange, P.A.

(57) ABSTRACT

The present application relates to a flexible fan module. The flexible fan module is to utilize the concept of male-female type connection to modulize a fan assembly, thereby not only having a concise mechanism and rapidly dismantling a fan main unit, but also being easily applicable in the number of one or more fan modules to the mechanism of a target device of which heat is desired to be dissipated, such as to the main housing of a personal computer, wherein no other designs of fixing mechanism are needed. The flexible fan module comprises: a fan main unit; a female member for fixing the flexible fan module on the target device; a female connecting member for connecting the female member to the fan main unit; a male member closely fitting into the female member; a handler member, wherein the handler member is connected to the fan main unit by penetrating the male member. The flexible fan module merely needs to fix the female member with at least one fixing element such as screws, and does not need to use or design other fixing and connecting elements.

10 Claims, 9 Drawing Sheets

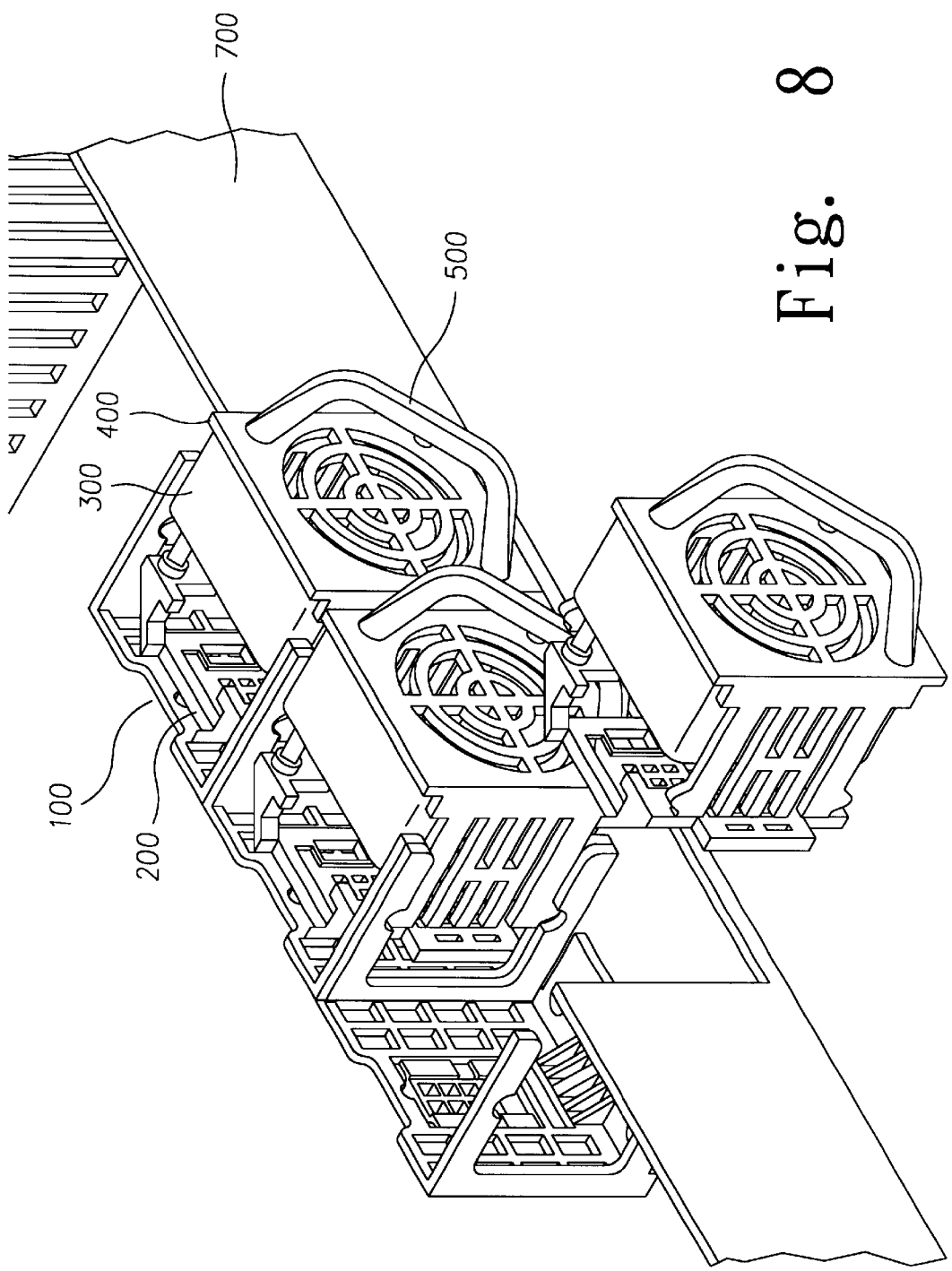

FLEXIBLE FAN MODULE

FIELD OF THE APPLICATION

The present application relates to a flexible fan module, and more particularly, to a fan module utilizing the concept of male-female type connection to modulize a fan assembly thereby having flexible combinations.

BACKGROUND OF THE APPLICATION

Heat-dissipating fan device is a commonly used technology in various industrial equipments, particularly in the electronic equipments having broad applications. With the maturity of integrated circuit technologies, all kinds of electronic products have been developing towards the aspects of lightness, thinness, shortness and smallness. Hence, various mechanisms of fan assembly are developed and presented to the market continuously.

For example, Taiwan Patent Publication No. 468891 discloses a power supply structure having a removable fan base, wherein the fan base cannot be sorely removed without dismantling a hollow main body of the power supply; Taiwan Patent Publication No. 339863 discloses a modulized heat-dissipating fan, wherein, since no female type structure is designed, extra mechanisms have to be designed for fixing the fan, and it takes a specific angle to remove the fan unit, so that it is quite uneasy to replace the fan unit; Taiwan Patent Publication No. 395528 discloses a removable fan structure, wherein no female structure exists, and the main structure of the fan assembly has to be greatly modified if the number and design of fans are changed, and further it is impossible to replace each of the fans individually. To sump up, just as described above, the existing fan products merely have a male-type design, and lack of a female-type design, so that extra elements have to be designed for fixing and connecting the components of the fans. Moreover, the overall space occupied by each of the fan products is quite large and does not have any flexibility to be adjusted. Thus, when it is necessary to increase the number of fans, the difficulty level associated therewith is very high, so that the heat-dissipation demands cannot be met through the increase of fan components. On the other hand, while the fan main unit needs replacing, the mechanism of target device (such as the main housing of person computer) of which the heat needs dissipating has to be first dismantled, and the mechanism of the entire fan assembly has be dismantled subsequently, such as a plurality of screws or fastening elements, etc., so as to eventually complete the replacement of the fan main unit.

Hence, there is an urgent need to develop a flexible fan module for overcoming the shortcomings of the conventional fan assembly mechanisms, wherein the fan module has a concise mechanism, and is able to replace its main unit rapidly, and is easily applicable in the number of one or more fan modules to the mechanism of a target device of which heat is desired to be dissipated without extra designs of fixing mechanism needed.

SUMMARY OF THE APPLICATION

Just as described above, the conventional fan assembly mechanism is not only difficult to be dismantled and replaced, causing the increase of maintenance cost, but also lacking of the design flexibility of increasing the number of fans, so that the heat-dissipation demands can not be satisfied due to the difficulty of expanding fan components.

Therefore, it is an object of the present application to provide a flexible fan module utilizing the concept of male-female type connection to form a modulized fan assembly, thereby overcoming the difficulty of replacing a conventional fan main unit.

It is another object of the present application to provide a flexible fan module for fulfilling the heat dissipation demands by flexibly increasing the number of fans with keeping the minimum mechanism change of target device of which heat is to be dissipated.

It is another object of the present application to provide a flexible fan module for combining connecting members with the fan main unit into one, wherein no extra design of connecting elements is needed. Merely with some simple fixing elements such as screws, the female member can be fixed on the target device without extra designs of fixing elements needed, thereby attaining the targets of convenience and integrity on mechanism designs.

In accordance with the aforementioned objects of the present application, the present application provides a flexible fan module comprising: a fan main unit; a female member having at least one fixing hole through which the female member can be firmly fixed on a target device by at least one fixing elements (such as screws); a female connecting member having a protrusion, a plurality of female connecting pins and a plurality of female connecting holes, wherein the protrusion is tightly inset in a recession portion located on the female member, and the connecting pins are connected to the fan main unit thereby connecting the female member to the fan main unit; a male member of which each of both sides has a plurality of stripe elements, wherein the utmost outer two stripe elements have a plurality of raised portions which is corresponding and tightly connected to a plurality of female notches located on the female member, and the open ends of the two stripe elements adjacent to the utmost outer two ones have a plurality of extension portions for insetting in the female connecting holes; a handler member having a plurality of handler connecting pins used for connecting the handler member to the fan main unit via the male connecting holes. According to the present application, the female member, the female connecting member and the male member are made of material of resilience, such as plastic, so that the members can be tightly connected to each other. The present application only needs to first use fixing elements to implement the required female members on a target device, and then to sequentially inset all other members besides female members in each other, and thereafter to insert each of the female connecting members into each of the female members. Since the present application only needs to use the space occupied by the female members, the present application has good expandability. On the other hand, to dismantle and replace the fan main unit, it merely needs to pull the female connecting member out of the female member, and then just to dismantle the handler member and the male member in sequence.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIG. 8 is a schematic diagram showing the flexible fan modules implemented on a target device according to the preferred embodiment of the present application.

DETAILED DESCRIPTION OF THE PREFERRED EMBODIMENT

The present application discloses a flexible fan module. The present application utilizes the concept of male-female connection to form a modulized fan assembly, thereby overcoming the shortcomings of the conventional fan assemblies. The present application not only has a concise mechanism design, but also can dismantle the fan main unit rapidly, and further can be applicable in the number of one or more flexible fan modules to the mechanism of a target device of which heat is desired to be dissipated, such as to the hollow housing of personal computer, and particularly does not need to design extra fan-fixing mechanisms.

Figure 1:
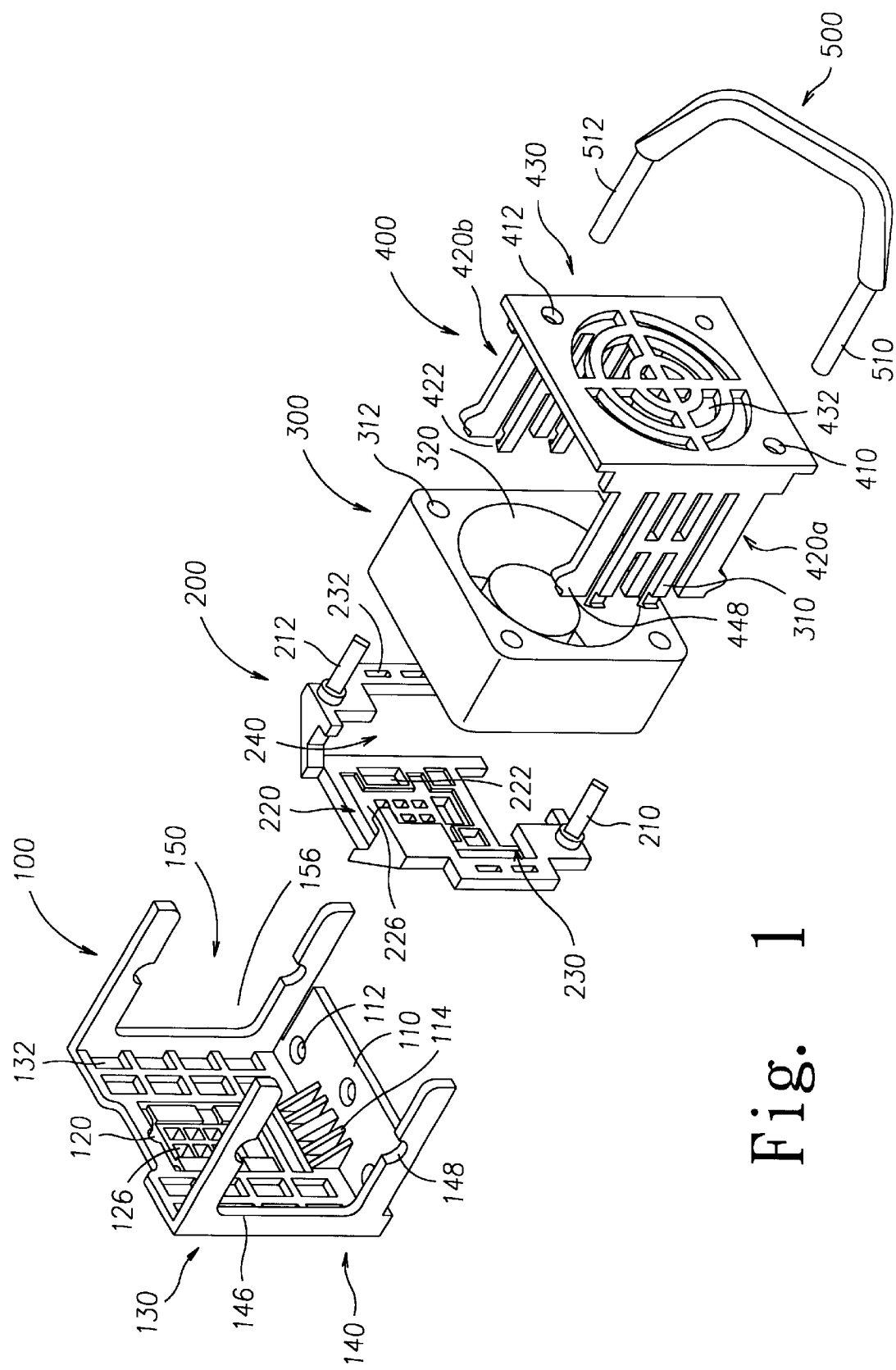
FIG. 1 is a schematic 3-D view showing a flexible fan module according to a preferred embodiment of the present application.
Figure 2A:
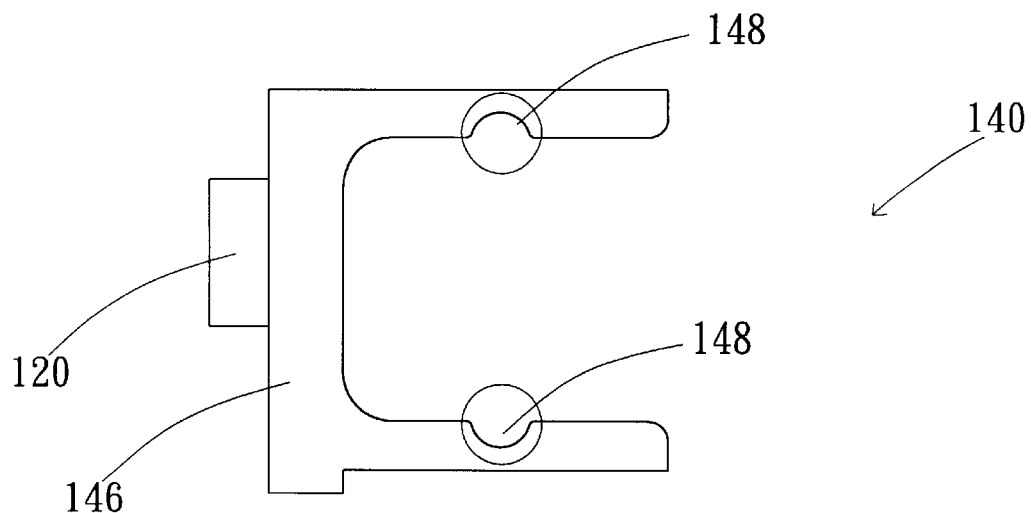
FIG. 2A is a schematic side view of the female member according to the preferred embodiment of the present application.
Figure 2B:
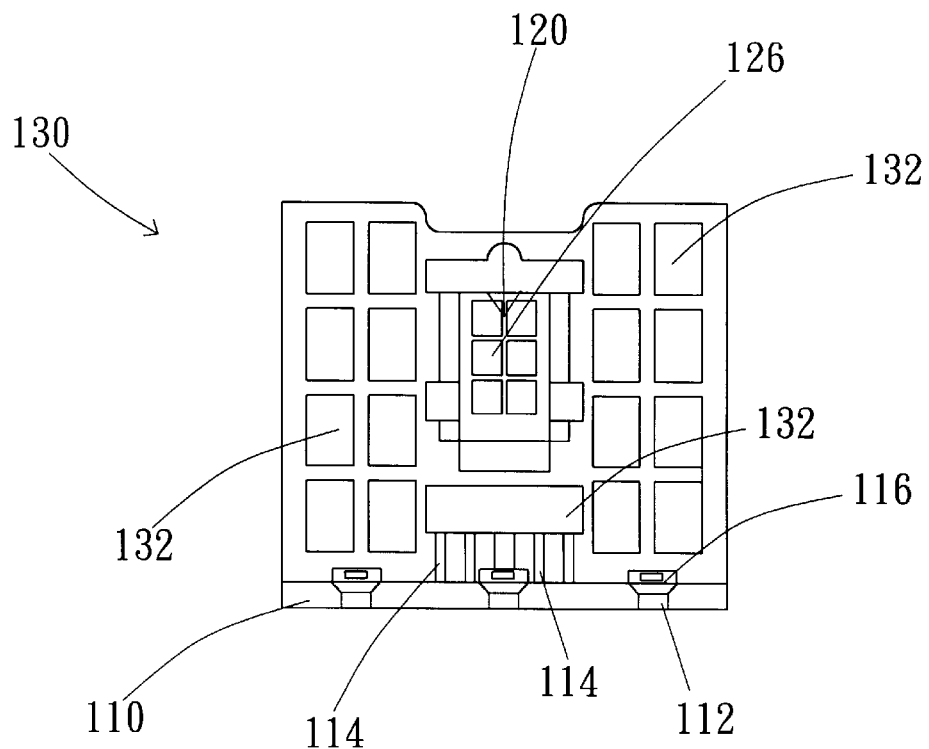
FIG. 2B is a schematic front view of the female member according to the preferred embodiment of the present application.
Figure 2C:
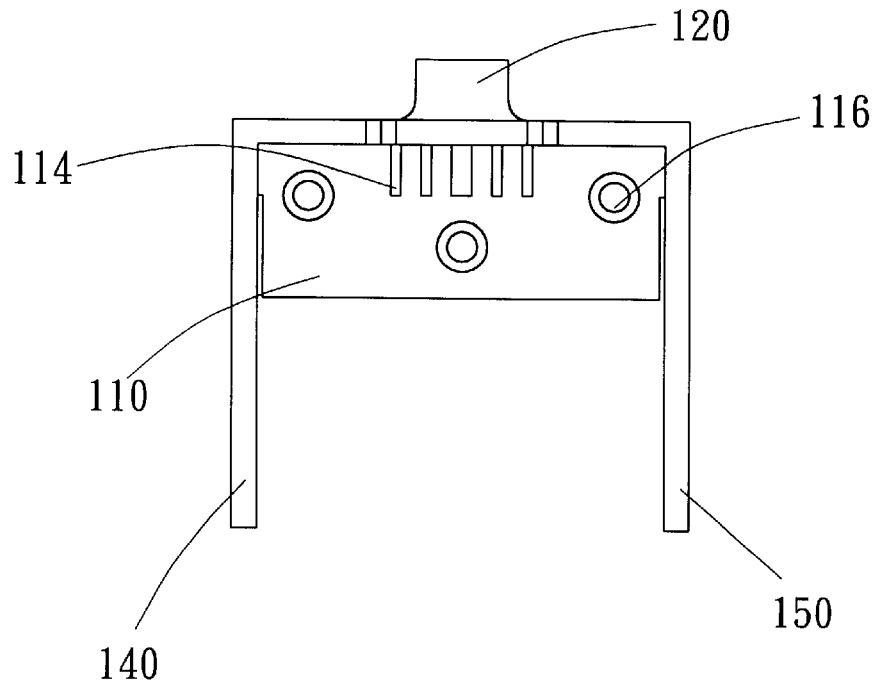
FIG. 2C is a schematic top view of the female member according to the preferred embodiment of the present application.
Figure 3A:
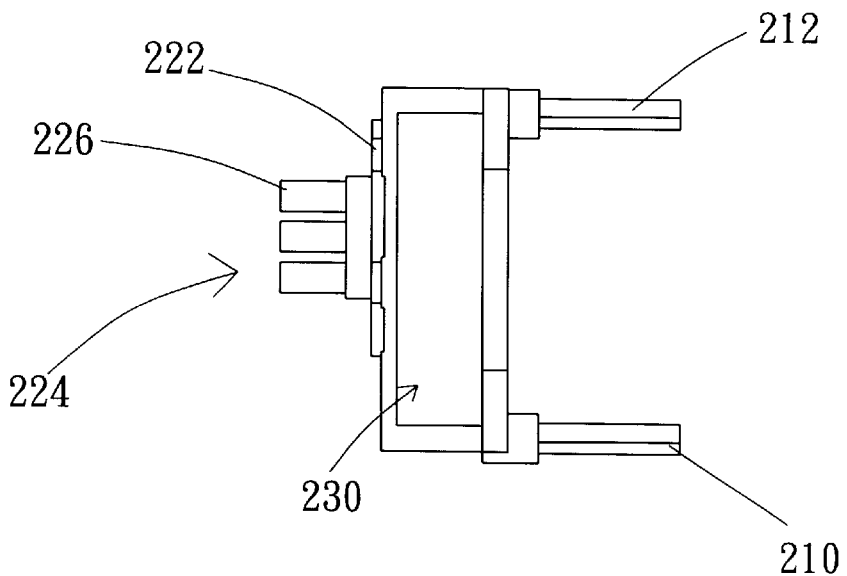
FIG. 3A is a schematic side view of the female connecting member according to the preferred embodiment of the present application.
Figure 3B:
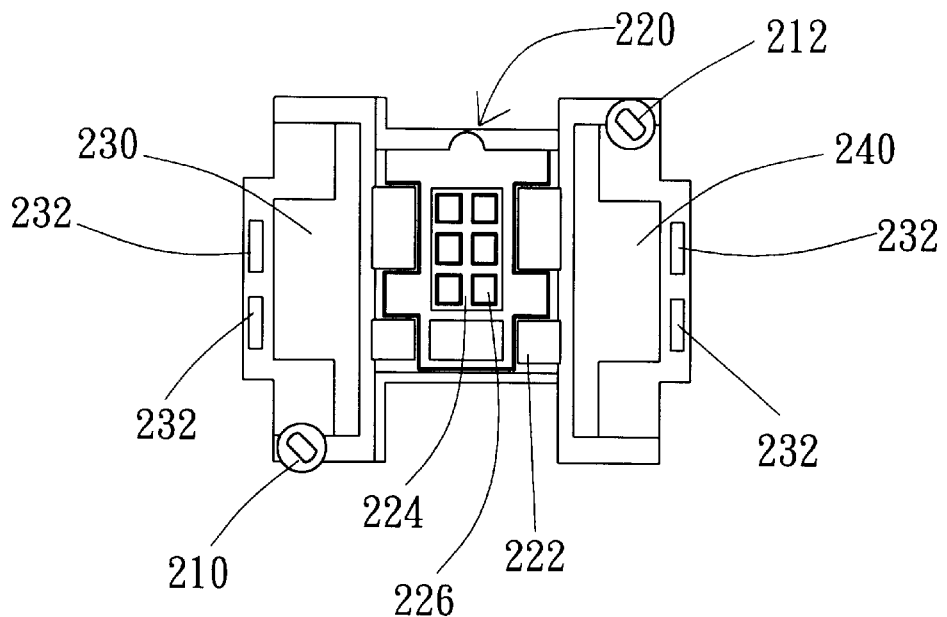
FIG. 3B is a schematic front view of the female connecting member according to the preferred embodiment of the present application.
Figure 3C:
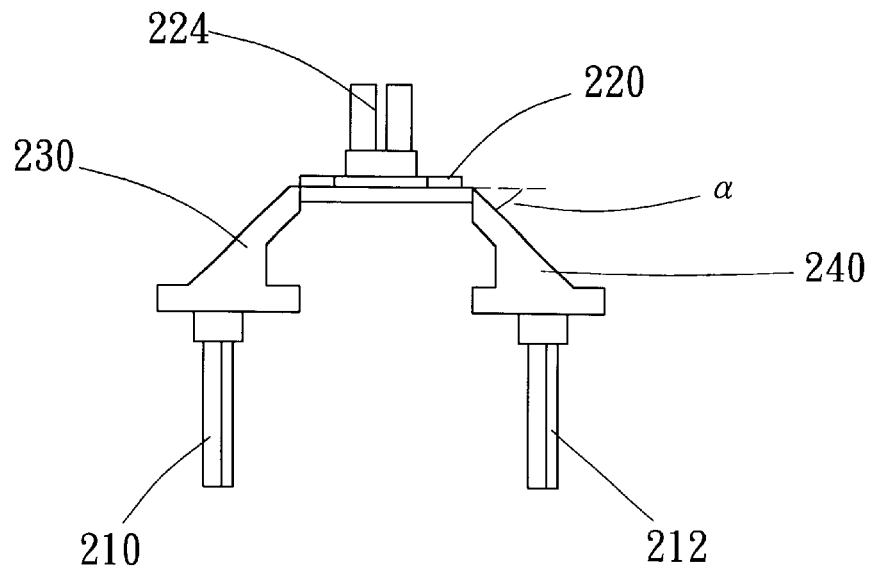
FIG. 3C is a schematic top view of the female connecting member according to the preferred embodiment of the present application.

Referring to FIG. 1, FIG. 1 is a schematic 3-D view showing a flexible fan module according to a preferred embodiment of the present application. The flexible fan module of the present application comprises: a fan main unit 300; a female member 100 used for fixing the flexible fan module on a target device (not shown); a female connecting member 200 used for connecting the female member 100 and the fan main unit 300; a male member 400 tightly inset in the female member 100, wherein the combination of the female connecting member 200 and the fan main unit 300 is located inside the combination of the male member 400 and the female member 100; a handler member 500 connected to the fan main unit 300 by passing through the male member 400, thereby a making conveniently removable the flexible fan module of the present application, and further reinforcing the structure of the flexible fan module.

The members and components of the present application are described as follows:

Referring to FIG. 1 and FIGS. 2A to 2C, FIGS. 2B to 2C are the schematic diagrams showing the front, side and top views of the female member according to the preferred embodiment of the present application. The female member 100 is composed of a pair of U-shape components 140 and 150, a female venting component 130 and a fixing component 110. Two vertical sides of the female venting component 130 are connected respectively to the closed ends 146 and 156 of the U-shape components 140 and 150. One side of the fixing component 110 is connected to the bottom side of the female venting component 130, wherein a plurality of reinforcing components 114 are formed therebetween for increasing the connecting strength, and at least one portion of the fixing component 110 is connected to the bottom sides of the U-shape components 140 and 150. The upper and lower sides of the U-shape components 140 and 150 have a plurality of female notches 148 tightly connected to the male member 400. The fixing component 110 further comprises at least one fixing hole 112 through which at least one fixing element 116 (such as screws) can be use to fix the female member 100 firmly on the target device (such as the main housing of person computer or notebook computer). The female venting component 130 also has a recession portion 120 to which the female connecting member 200 is connected, wherein the recession portion 120 has a plurality of first wiring holes 126 used for letting the wires (such as a power cord, etc.) required by the fan main unit 300 pass through.

Figure 4:
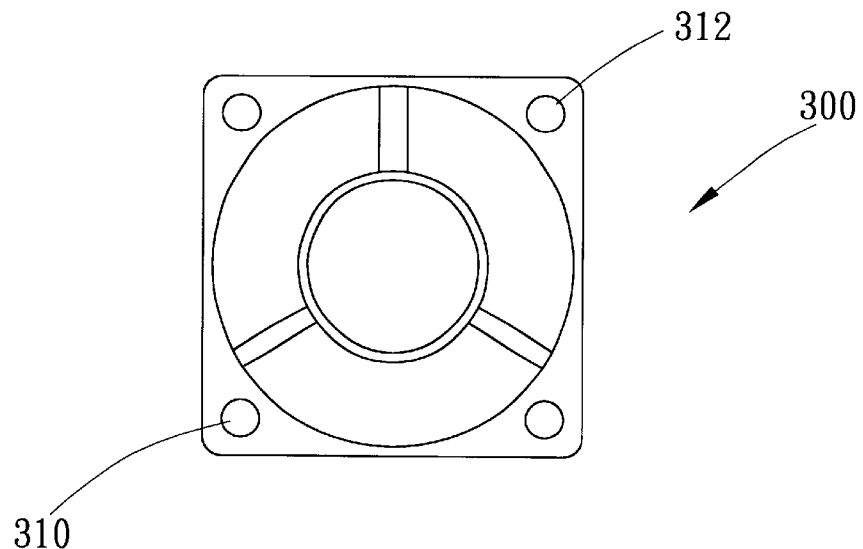
FIG. 4 is a schematic front view of the fan main unit according to the preferred embodiment of the present application.
Figure 5A:
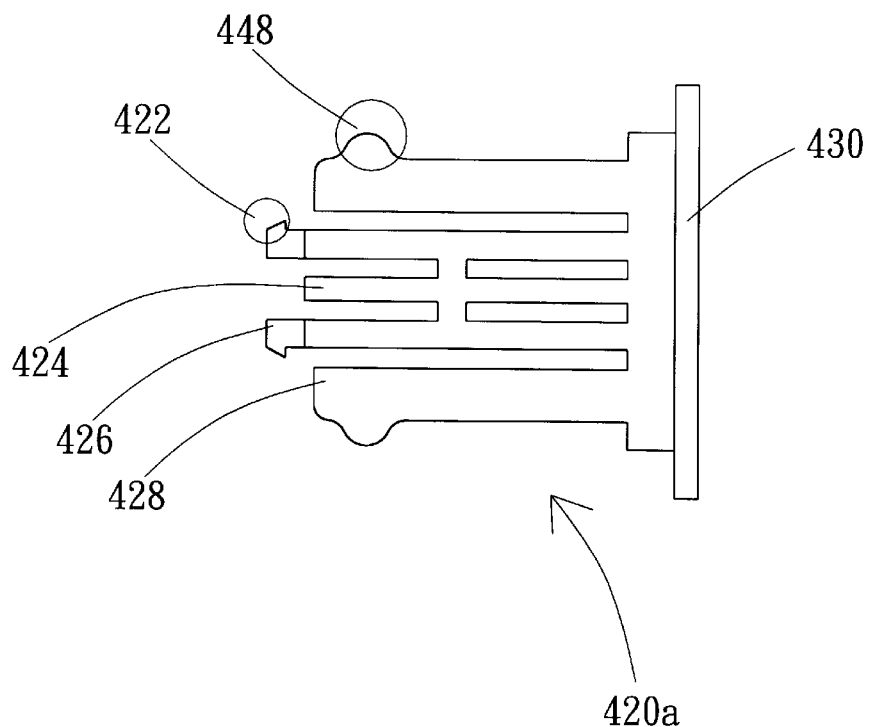
FIG. 5A is a schematic side view of the male member according to the preferred embodiment of the present application.
Figure 5B:
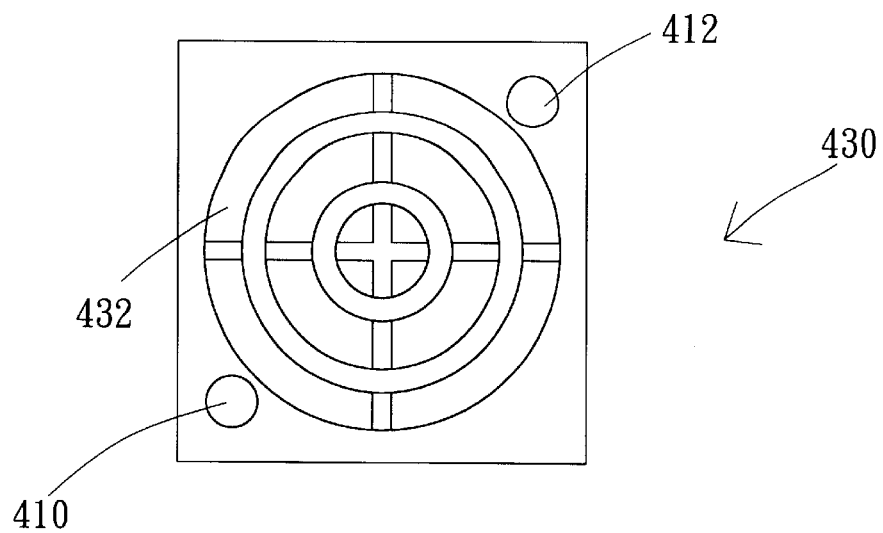
FIG. 5B is a schematic front view of the male member according to the preferred embodiment of the present application.
Figure 5C:
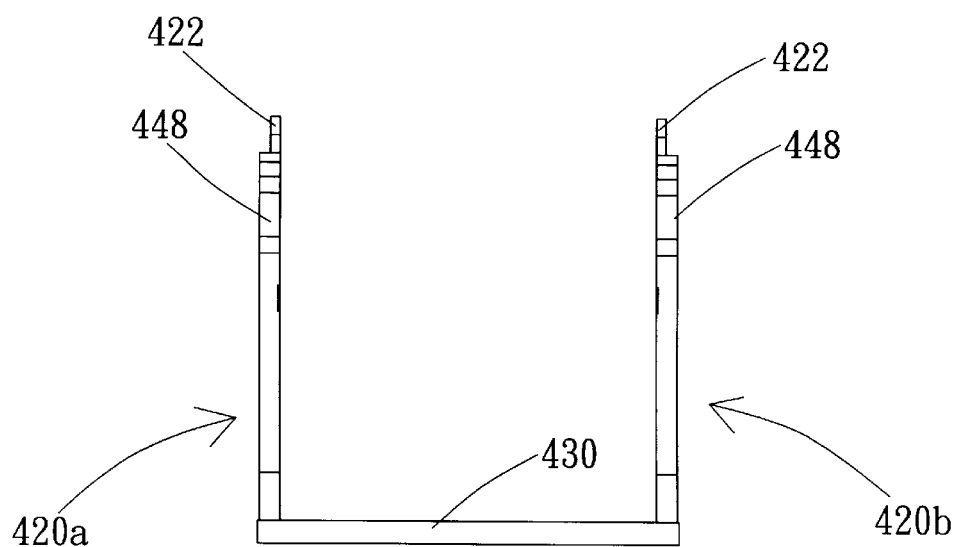
FIG. 5C is a schematic top view of the male member according to the preferred embodiment of the present application.

Referring to FIG. 1 and FIGS. 3A to 3C, FIGS. 3A to 3C are the schematic diagrams showing the front, side and top views of the female connecting member according to the preferred embodiment of the present application. The female connecting member 200 is composed of a plurality of female connecting pins 210 and 212 (such as two or even number of female connecting pins), a connecting component 220 and frame components 230 and 240. The frame components 230 and 240 are respectively connected to two opposite sides of the connecting component 220 at the connecting angle α, and each of the frame components 230 and 240 has a plurality of female connecting holes 232 (such as two or even number of holes) so as to tightly connecting the female connecting member 200 to the male member 400. The connecting component 220 has a plurality of second venting holes 222 and a protrusion portion 224, wherein the protrusion portion 224 is inset in the recession portion 120 so as to connect the female member 100 to the female connecting member 200. The protrusion portion 224, also has a plurality of second wiring holes 226, which are used together with the first wiring holes 126 used for letting the wires (such as a power cord, etc.) required by the fan main unit 300 pass through. Please also refer to FIG. 4, FIG. 4 is a schematic front view of the fan main unit according to the preferred embodiment of the present application. The fan main unit 300 has at least one pair of fan connecting holes 310 and 312 respectively located on both ends of a diagonal line on the venting opening surface 320. The female connecting pins 210 and 212 are respectively located on both ends of a diagonal line on the surface formed by the frame components 230 and 240, and penetrate the fan connecting holes 310 and 312 so as to connect the female connecting member 200 to the fan main unit 300.

Referring to FIG. 1 and FIGS. 5A to 5C, FIGS. 5A to 5C are the schematic diagrams showing the front, side and top views of the male member according to the preferred embodiment of the present application. The male member 400 is composed of a male venting component 430 and two stripe-component groups 420*a* and 420*b* which are respectively located on both sides of the male venting component 430. Each of the stripe-component groups 420*a* and 420*b* comprises: a middle stripe element 424; two inner stripe elements 426 adjacent to both sides of the middle stripe element 424; and two outer stripe elements 428 located on the utmost outer sides. Each of the outer stripe elements 428 has at least one raised portion 448 that is corresponding and tightly connected to the female notches 148 of the female member 100. The open ends of the inner stripe elements 426 have a plurality of extension portions 422 insetting in the female connecting holes 232. The male venting component 430 has a plurality of for example annular male venting holes 432 through which the air convection occurs for heat dissipation. The male venting component 430 also has at least one pair of male connecting holes 410 and 412 located at both ends of a diagonal line of the surface having the male venting holes 432, thereby connecting the male member 400 to the handler member 500.

Figure 6:
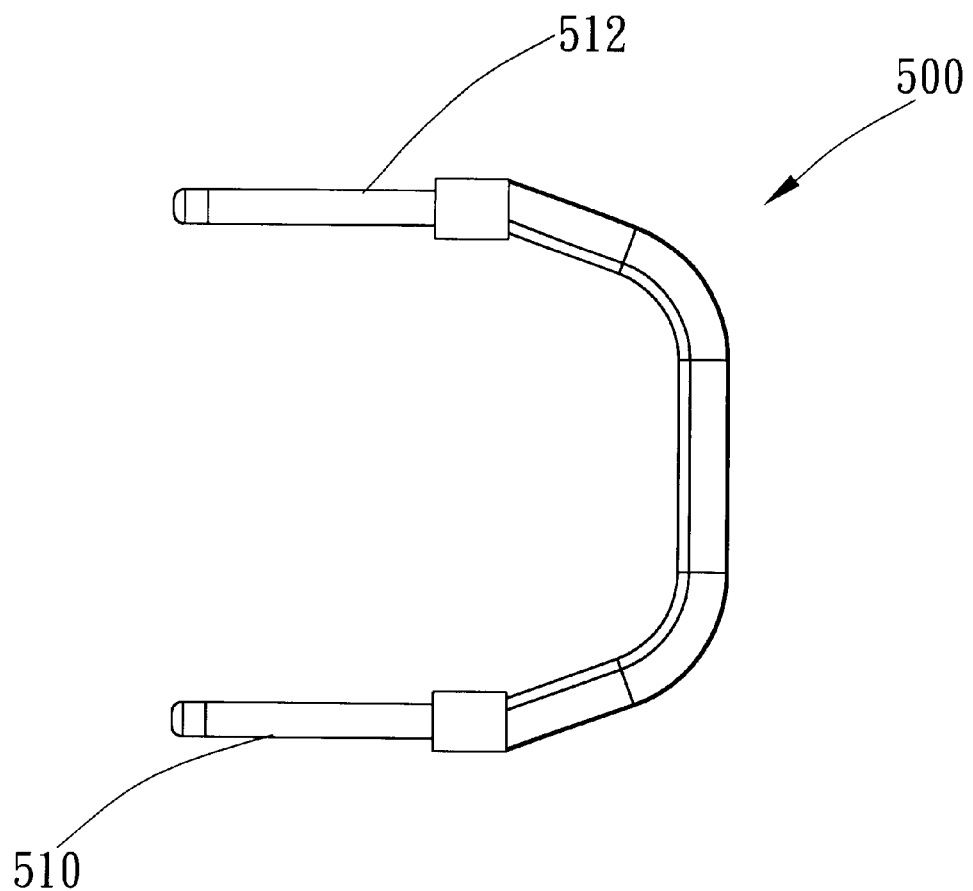
FIG. 6 is a schematic front view of the handler member according to the preferred embodiment of the present application.

Referring to FIG. 1 and FIG. 6, FIG. 6 is a schematic front view of the handler member according to the preferred embodiment of the present application. The handler member 500 has a plurality of handler connecting pins 510 and 512 (such as two or even number of handler connecting pins) for connecting the handler member 500 to the fan main unit 300 via the male connecting holes 410 and 412, wherein the handler connecting pins 510 and 512 can be inserted into the fan connecting holes 310 and 312, or into other two fan connecting holes (not labeled) via other male connecting holes (not labeled) which are on both ends of the diagonal line opposite to the diagonal line formed by the fan connecting holes 310 and 312.

Figure 7:
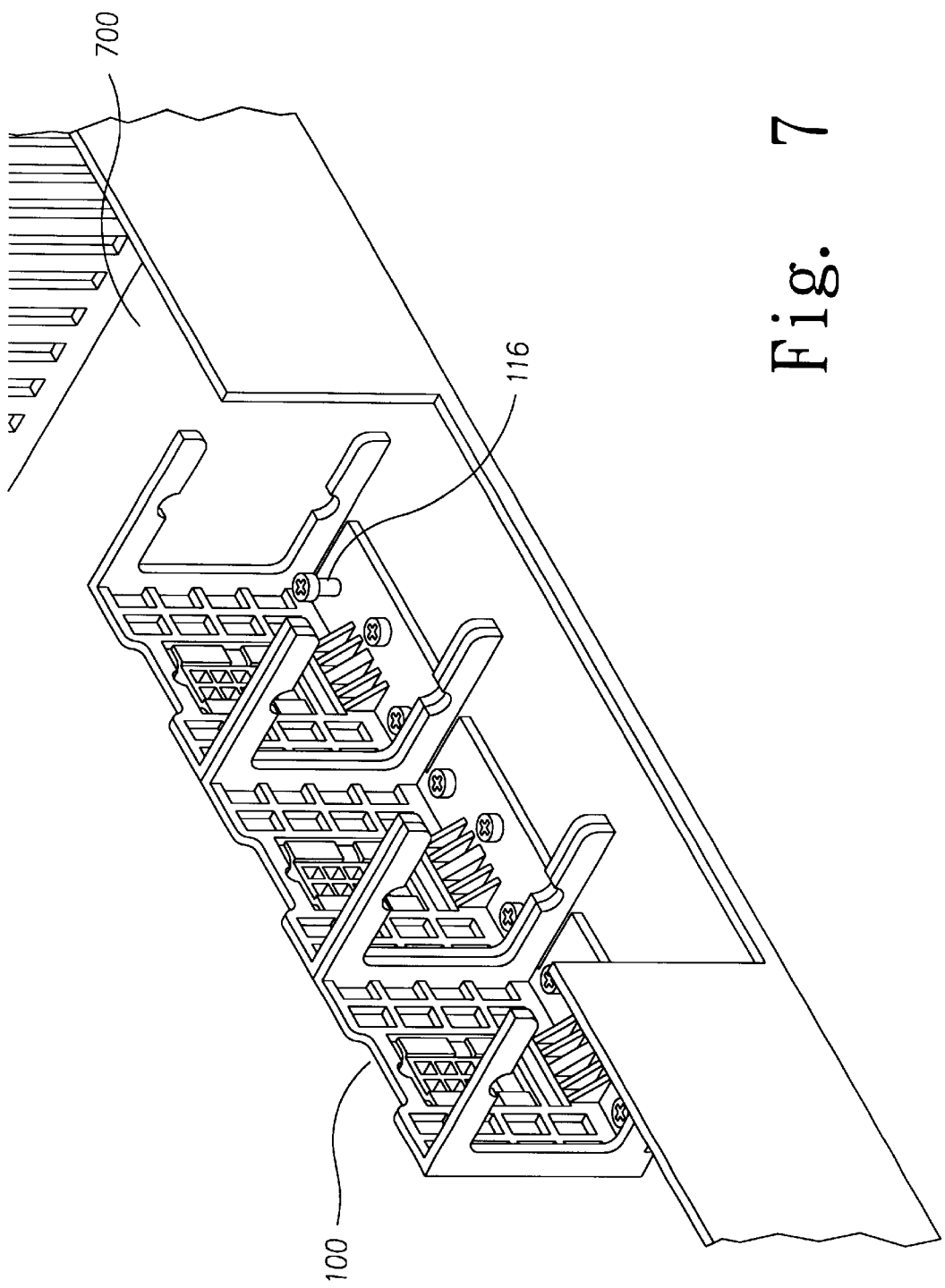
FIG. 7 is a schematic diagram showing the female members implemented on a target device according to the preferred embodiment of the present application.

On the other hand, referring FIG. 7 and FIG. 8, FIG. 7 is a schematic diagram showing the female members implemented on a target device according to the preferred embodiment of the present application, and FIG. 8 is a schematic diagram showing the flexible fan modules implemented on a target device according to the preferred embodiment of the present application, wherein the number of the female members 100 is three for installing three sets of flexible fan module of the present application. While actually enabling the present application, users only need to first fix a certain amount of female members 100 on a target device 700 by means of the fixing elements 116, and then sequentially inset the members and components in each other except the female members, and thereafter respectively inert the protrusion portions (not shown) of the female connecting members 200 into the recession portions (not shown) of the female members 100. Since the present application only needs to use the space occupied by the female member 100 in the target device 700, the present application has excellent expandability. Furthermore, when dismantling and replacing the fan main unit, users only need to pull out the protrusion portion of the female connecting member 200 out of the female member 100, and then dismantle the handler member 500 and the male member 400 in sequence.

It is noted that the present application utilizes the material of resilience (such as plastic) to fabricate the female member, the female connecting member and the male member, so as to make the members tightly connected to each other. Further, the shapes, numbers and locations of the related members as described above are merely stated as the examples for explanation, and the present application is not limited thereto.

Hence, an advantage of the present application is to provide a flexible fan module utilizing the concept of male-female type connection to modulize the fan assembly. The present application can effectively overcome the difficulty of dismantling and replacing the conventional fan main unit, thereby saving the manpower and material.

Another advantage of the present application is to provide a flexible fan module. The present application can fulfill the demands of heat dissipation by flexibly increasing the number of fans, thereby minimizing the mechanism modifications of target device, therefore having a highly industrial application value.

Another advantage of the present application is to provide a flexible fan module. The present application can combine the connecting members and the fan main unit into one, and does not need to design extra connecting elements. The present application only needs to use the fixing elements such as screws to fix the female member on the target device of which heat is desired to be dissipated, and does not need to design extra fixing elements. Therefore, the present application can attain the targets of convenience and integrity on mechanism design.

As is understood by a person skilled in the art, the foregoing preferred embodiments of the present application are illustrated of the present application rather than limiting of the present application. It is intended to cover various modifications and similar arrangements included within the spirit and scope of the appended claims, the scope of which should be accorded the broadest interpretation so as to encompass all such modifications and similar structures.

What is claimed is:

1. A flexible fan module, wherein said flexible fan module is installed on a target device of which heat is desired to be dissipated, and said flexible fan module comprises:

a fan main unit having at least one pair of fan connecting holes located on both ends of a diagonal line of a venting opening surface on said fan main unit;

a female member used for fixing said flexible fan module on said target device;

a female connecting member used for connecting said female member to said fan main unit; and a male member closely inset in said female member, wherein the combination of said female connecting member and said fan main unit is located inside the combination of said male member and said female member.

2. The flexible fan module of claim 1, wherein said female member further comprises:

a pair of U-shape components, wherein the upper and lower sides of each of said pair of U-shape components has a plurality of female notches used for tightly connecting said female member to said male member;

a female venting component connected to a closed end of each of said U-shape components, wherein said female venting component has a plurality of first venting holes through which air convection occurs for heat dissipation, and has a recession portion used for connecting said female member to said female connecting member, the recession portion further comprising:

a plurality of first wiring holes used for letting at least one wires required by said fan main unit pass through; and a fixing component, wherein a side of said fixing component is connected to a bottom side of said female venting component, and a plurality of reinforcing components are implemented for increasing the connecting strength, each of two sides adjacent to said side of said fixing component having at least one portion connected to a lower side of each of said U-shape components, said fixing component having at least one fixing hole through which at least one fixing element is used for fixing said female member on said target device.

3. The flexible fan module of claim 2, wherein said female connecting member comprises:

a connecting component having a plurality of second venting holes and a protrusion portion, wherein said protrusion portion is inset in said recession portion thereby connecting said female member to said female connecting member, said protrusion portion having a plurality of second wiring holes used together with said first wiring holes to let said at least one wires required by said fan main unit pass through;

a pair of frame components respectively connected to two opposite sides of said connecting component at a connecting angle, said pair of frame components having a plurality of female connecting holes for closely insetting in said male member; and a plurality of female connecting pins located on both ends of a diagonal line on a surface formed by said frame components, wherein said female connecting pins are respectively used to be inserted into said at least one pair of fan connecting holes, thereby connecting said female connecting member to said fan main unit.

4. The flexible fan module of claim 3, wherein the number of said female notches is an even number.

5. The flexible fan module of claim 3, wherein said male member comprises:

a male venting component having a plurality of male venting holes provided for air convection having the function of heat dissipation, said male venting component having at least one pair of male connecting holes located on both ends of a diagonal line on a surface on which said male venting holes are located, thereby connecting said male member to a handler member; and two stripe-component groups, wherein each of said stripe-component groups comprises:

a middle stripe element located in the central area of each of said stripe-component groups;

two inner stripe elements located adjacent to said middle stripe element, wherein the open ends of said inner stripe elements has a plurality of extension portions used for insetting in said female connecting holes respectively; and two outer stripe elements located on the utmost outer sides of each of said stripe-component groups, wherein each of outer stripe elements has at least one raised portion, each of said at least one raised portion which is corresponding and tightly connected to each of said female notches of said female member.

6. The flexible fan module of claim 5, wherein said flexible fan module further comprises:

said handler member, wherein said handler member is connected to said fan main unit by penetrating said male member, thereby conveniently removing said flexible fan module and reinforcing the structure of said flexible module, said handler member further comprising:

a plurality of handler connecting pins, wherein each of said handler connecting pins first penetrates each of said at least one pair of male connecting holes, and then penetrates each of said at least one pair of fan connecting holes, thereby connecting said handler member to said fan main unit.

7. The flexible fan module of claim 6, wherein the number of said handler connecting pins is an even number.

8. A flexible fan module, wherein said flexible fan module is installed on a target device of which heat is desired to be dissipated, and said flexible fan module comprises:

a fan main unit having at least one pair of fan connecting holes located on both ends of a diagonal line of a venting opening surface on said fan main unit;

a female member used for fixing said flexible fan module on said target device, wherein said female member further comprises:

a pair of U-shape components, wherein the upper and lower sides of each of said pair of U-shape components has a plurality of female notches used for tightly connecting said female member to said male member;

a female venting component connected to a closed end of each of said U-shape components, wherein said female venting component has a plurality of first venting holes through which air convection occurs for heat dissipation, and has a recession portion used for connecting said female member to said female connecting member, the recession portion further comprising:

a plurality of first wiring holes used for letting at least one wires required by said fan main unit pass through; and a fixing component, wherein a side of said fixing component is connected to a bottom side of said female venting component, and a plurality of reinforcing components are implemented for increasing the connecting strength, each of two sides adjacent to said side of said fixing component having at least one portion connected to a lower side of each of said U-shape components, said fixing component having at least one fixing hole through which at least one fixing element is used for fixing said female member on said target device; and a female connecting member used for connecting said female member to said fan main unit, wherein said female connecting member further comprises:

a connecting component having a plurality of second venting holes and a protrusion portion, wherein said protrusion portion is inset in said recession portion thereby connecting said female member to said female connecting member, said protrusion portion having a plurality of second wiring holes used together with said first wiring holes to let said at least one wires required by said fan main unit pass through;

a pair of frame components respectively connected to two opposite sides of said connecting component at a connecting angle, said pair of frame components having a plurality of female connecting holes for closely insetting in said male member; and a plurality of female connecting pins located on both ends of a diagonal line on a surface formed by said frame components, wherein said female connecting pins are respectively used to be inserted into said at least one pair of fan connecting holes, thereby connecting said female connecting member to said fan main unit;

a male member closely inset in said female member, wherein the combination of said female connecting member and said fan main unit is located inside the combination of said male member and said female member, and said male member further comprises:
a male venting component having a plurality of male venting holes provided for air convection having the function of heat dissipation, said male venting component having at least one pair of male connecting holes located on both ends of a diagonal line on a surface on which said male venting holes are located, thereby connecting said male member to a handler member; and
two stripe-component groups, wherein each of said stripe-component groups comprises:
a middle stripe element located in the central area of each of said stripe-component groups;
two inner stripe elements located adjacent to said middle stripe element, wherein the open ends of said inner stripe elements has a plurality of extension portions used for insetting in said female connecting holes respectively; and
two outer stripe elements located on the utmost outer sides of each of said stripe-component groups, wherein each of outer stripe elements has at least one raised portion, each of said at least one raised portion which is corresponding and tightly connected to each of said female notches of said female member; and
said handler member, wherein said handler member is connected to said fan main unit by penetrating said male member, thereby conveniently removing said flexible fan module and reinforcing the structure of said flexible module, said handler member further comprising:
a plurality of handler connecting pins, wherein each of said handler connecting pins first penetrates each of said at least one pair of male connecting holes, and then penetrates each of said at least one pair of fan connecting holes, thereby connecting said handler member to said fan main unit.

9. The flexible fan module of claim 8, wherein the number of said female notches is an even number.

10. The flexible fan module of claim 8, wherein the number of said handler connecting pins is an even number.

\* \* \* \* \*